United States Patent [19]
Gardner et al.

[11] Patent Number: 6,043,533
[45] Date of Patent: Mar. 28, 2000

[54] METHOD OF INTEGRATING LDD IMPLANTATION FOR CMOS DEVICE FABRICATION

[75] Inventors: Mark I. Gardner, Cedar Creek; Fred Hause; Robert Paiz, both of Austin, all of Tex.

[73] Assignee: Advanced Micro Devices, Inc., Sunnyvale, Calif.

[21] Appl. No.: 08/944,377

[22] Filed: Oct. 6, 1997

Related U.S. Application Data

[62] Division of application No. 08/798,639, Feb. 11, 1997.

[51] Int. Cl.[7] .......................... H01L 29/76; H01L 29/94; H01L 31/062; H01L 31/113
[52] U.S. Cl. ............................................. 257/336; 257/344
[58] Field of Search ...................... 257/336, 344

[56] References Cited

U.S. PATENT DOCUMENTS 5,489,540  2/1996  Liu ............................................. 437/30

*Primary Examiner*—S. D. Meier
*Attorney, Agent, or Firm*—Jenkens & Gilchrist, A Professional Corporation

[57] ABSTRACT

A method of integrating lightly doped drain implantation for complementary metal oxide semiconductor (CMOS) device fabrication includes providing a semiconductor substrate having a p-well region and an n-well region. A patterned gate oxide and gate electrode are formed on each of the p-well region and the n-well region. One of either the p-well region or the n-well region is masked with a patterned photoresist having a prescribed thickness, leaving a non-masked region exposed. Ions are then implanted to form desired p-type lightly doped drain (Pldd) regions in the n-well region, including Pldd regions adjacent to edges of the gate electrode in the n-well region. Lastly, ions are implanted to form desired n-type lightly doped drain (Nldd) regions in the p-well region, including Nldd regions adjacent to edges of the gate electrode in the p-well region, the Pldd and Nldd regions thus being formed with the use of only a single ion implantation masking step. A semiconductor substrate and an integrated circuit are also disclosed.

7 Claims, 2 Drawing Sheets

METHOD OF INTEGRATING LDD IMPLANTATION FOR CMOS DEVICE FABRICATION

This application is a division of application Ser. No. 08/798,639, filed Feb. 11, 1997 pending.

BACKGROUND OF THE INVENTION

1. Field of the Invention

This invention relates generally to field effect transistor structures and, more particularly, to high performance MOSFET transistor structures and a method for making the same.

2. Discussion of the Related Art

A field-effect transistor (FET) is a solid state amplifying device. Amplification in the device occurs when the current through two terminals is varied by an electric field arising from voltage applied to a third terminal. The FET is thus a voltage controlled device. In an insulated-gate to (IG) type of FET, the controlling field appears at an insulating layer. Variations in the field cause corresponding variations in the current through the device. Because the input or control voltage is applied across an insulator, the FET is further characterized by a high input impedance.

In the IGFET, the channel current is controlled by a voltage at a gate electrode which is isolated from the channel by an insulator. In one common configuration, an oxide layer is grown or deposited on the semiconductor surface, and a polysilicon gate electrode is deposited onto this oxide layer. The resulting structure is commonly called a metal-oxide-semiconductor (MOS) structure. If the device includes a source and drain, it represents an MOS transistor or MOSFET. The MOSFET has the advantage of extremely high input impedance between the gate and source electrodes, since these terminals are separated by an oxide layer. The general term IGFET includes devices in which the insulator may be some material other than an oxide layer.

In further discussion of the above, a MOSFET can be either a depletion device or an enhancement device. The depletion device MOSFET is one in which a channel exists at zero gate voltage. The depletion device is thus referred to as a normally on device. On the other hand, the enhancement device MOSFET is a device which requires a gate voltage to induce a channel and is further referred to as a normally off device. Furthermore, the MOSFET is either an n-channel or a p-channel device, depending upon the carrier type in the channel.

In an n-channel device, the source and drain regions include $n^+$ regions diffused into a high-resistivity p substrate. The channel region may be either a thin diffused n layer or an induced inversion region. In an n-type diffused channel device, the effect of the electric field is to raise or lower the conductance of the channel by either depleting or enhancing the electron density in the channel. When a positive voltage is applied to the gate (i.e., at the oxide-semiconductor interface), an electric field in the oxide layer exists between positive charge on the gate electrode and negative charge in the semiconductor. The negative charge is composed of an accumulation of mobile electrons into the channel and fixed ionized acceptor atoms in the depleted p material. If the gate-to-source voltage is positive, the conductivity of the channel is enhanced, while a negative gate voltage tends to deplete the channel of electrons. Thus a diffused-channel MOSFET can be operated in either the depletion or enhancement modes.

In an induced-channel MOSFET transistor, for an n-channel device, there is no diffused n-type region existing between source and drain at equilibrium. When a positive gate voltage is applied to the structure, a depletion region is formed in the p material, and a thin layer of mobile electrons is drawn from the source and drain into the channel. Where the mobile electrons dominate, the material is effectively n-type. This is called an inversion layer, since the material was originally p-type. Once the inversion layer is formed near the semiconductor surface, a conducting channel exists from the source to the drain. The operation of the device is then quite similar as discussed above. The channel conductance is controlled by the field in the insulator, but the magnitude of this field varies along the channel ($V_{Gx}$) from the voltage at the drain ($V_{GS}$-$V_{DS}$) to the voltage at the source ($V_{GS}$). Since a positive voltage is required between the gate and each point x in the channel to maintain inversion, a large enough value of $V_{DS}$ can cause the field in the insulator to go to zero at the drain. As a result there is a small depleted region at the drain end of the channel through which electrons are injected in the saturation current. Once pinch-off is reached, the saturation current remains essentially constant. A p-channel MOSFET is similar to the n-channel, however, the conductivity types are reversed.

In addition, in the present state of the art, miniaturization of field-effect transistor device dimensions is continually being sought. Several limitations on miniaturization of FET devices have been encountered. For instance, it is extremely difficult to form FETs with the channel other than parallel to the substrate. Thus, the size of the transistor cannot generally be made smaller than the size of the gate or the channel. Furthermore, as the channel is made small, adverse effects on transistor performance occur. Modifications of existing techniques for fabrication of FET device structures introduce performance degradations into fabricated devices and limit performance characteristics of the same.

Fabrication of integrated circuit devices also involves numerous process steps which add to a cost of manufacturing the integrated circuit devices. It would thus be desirable to provide an improved method of making integrated circuit devices by reducing the number of process steps.

SUMMARY OF THE INVENTION

An object of the present invention is to reduce the number of ion implantation masking steps in the formation of ldd regions in a semiconductor substrate for advanced CMOS integrated circuit device structures.

Another object according to the present invention is to improve the manufacture of advanced CMOS integrated circuit device structures.

According to the present invention, a method of integrating lightly doped drain implantation for complementary metal oxide semiconductor (CMOS) device fabrication includes providing a semiconductor substrate having a p-well region and an n-well region. A patterned gate oxide and gate electrode are formed on each of the p-well region and the n-well region. One of either the p-well region or the n-well region is masked with a patterned photoresist having a prescribed thickness, to leaving a non-masked region exposed. Ions are then implanted to form desired p-type lightly doped drain (Pldd) regions in the n-well region, including Pldd regions adjacent to edges of the gate electrode in the n-well region. Lastly, ions are implanted to form desired n-type lightly doped drain (Nldd) regions in the p-well region, including Nldd regions adjacent to edges of the gate electrode in the p-well region, the Pldd and Nldd regions thus being formed with the use of only a single ion implantation masking step.

Further in accordance with the present invention, a semiconductor substrate and an integrated circuit are also disclosed. The semiconductor substrate having lightly doped drain regions is formed by the method including the steps of providing a semiconductor substrate having a p-well region and an n-well region. A patterned gate oxide and gate electrode are formed on each of the p-well region and the n-well region. One of either the p-well region or the n-well region are masked with a patterned photoresist having a prescribed thickness, leaving a non-masked region exposed. Ions are implanted to form desired p-type lightly doped drain (Pldd) regions in the n-well region, including Pldd regions adjacent to edges of the gate electrode in the n-well region. Lastly, ions are implanted to form desired n-type lightly doped drain (Nldd) regions in the p-well region, including Nldd regions adjacent to edges of the gate electrode in the p-well region. The Pldd and Nldd regions are thus formed with the use of only a single ion implantation masking step. The integrated further includes an NMOS transistor device formed in the p-well region and a PMOS transistor device formed in the n-well region, wherein the NMOS transistor is characterized by a deep doping p+ profile in the p-well which substantially tracks a shape of a respective overlying gate oxide and gate electrode.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
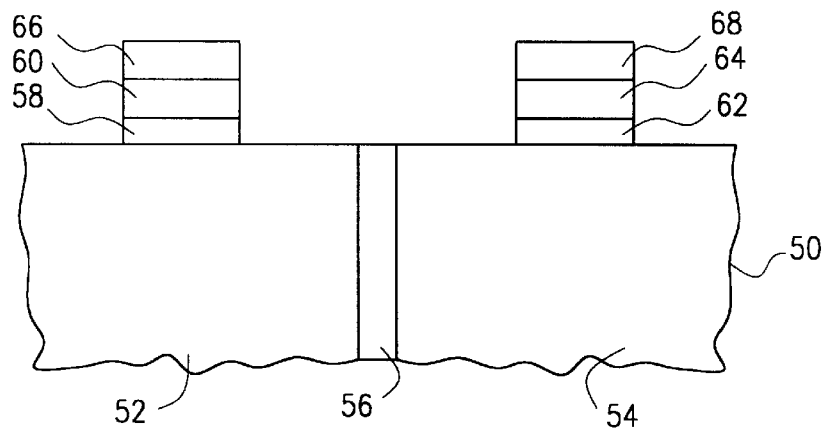
FIGS. 1–3 illustrate various steps of a method of integrating lightly doped drain (ldd) implantation for CMOS circuit fabrication according to the present invention.

Turning now to FIG. 1, beginning with a semiconductor substrate 50, such as a p+ substrate having a p– epitaxial layer on a top surface thereof, a p-well 52 and an n-well 54 are formed using conventional techniques. An isolation region 56 is also formed in between the p-well 52 and the n-well 54, such as any suitable trench isolation known in the art. Next a gate oxide 58, 62 and gate electrode 60, 64 are formed over respective p-well 52 and n-well 54 regions using standard known techniques. As shown, a photoresist 66, 68 used in the formation of a respective gate oxide 58, 62 and polysilicon gate electrode 60, 64 is left in place on top of a respective gate oxide 58, 62 and polysilicon gate electrode 60, 64. Alternatively, the photoresist 66, 68 may also be stripped, i.e., removed prior to additional processing, as will be discussed herein below.

Semiconductor substrate 50 includes any suitable commercially available substrate, for example, which may include a p-type bulk substrate on the order of 725 $\mu$m having a p-type epitaxial layer on a top surface thereof. The p-epi layer can have a thickness on the order of 4–8 $\mu$m. Due to the relative thickness of the epi-layer in comparison with the bulk substrate, only the epi-layer portion of substrate 50 is shown in the figures (FIGS. 1–4).

Typically, an Ldd (lightly doped drain) implantation requires two masking steps for advanced CMOS (complementary metal oxide semiconductor) fabrication. The advanced Deep Ion Implantation (DII) method of the present invention advantageously requires only one masking step without a traditional counterdoping of the Ldd regions.

Figure 2:
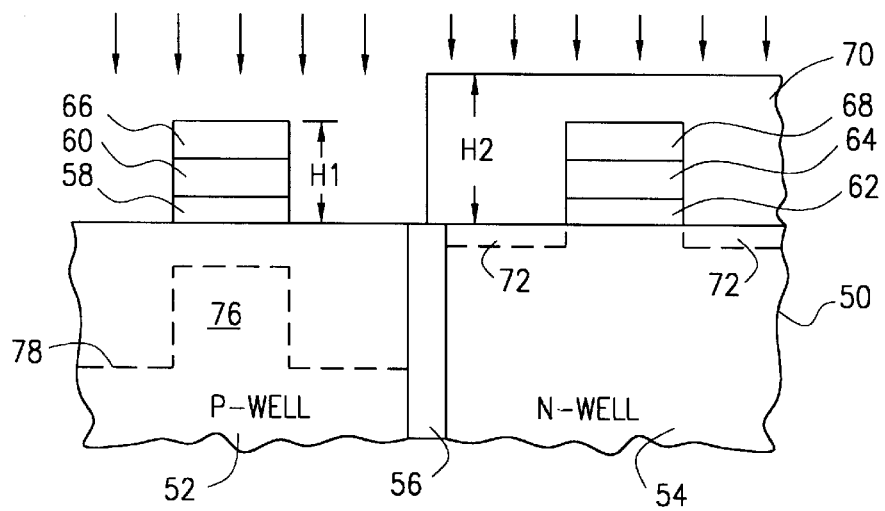

Referring flow to FIG. 2, subsequent to the gate polysilicon formation 60, 64, a photoresist (PR) 70 is coated over the top surface 72 of the substrate 50 and the polysilicon gate electrodes 60, 64. The photoresist 70 is then patterned for exposing the p-well region 52 such that the p-well is open (i.e., non masked) while the n-well region 54 remains covered by the photoresist 70. Photoresist 70 can comprise any suitable photoresist known in the art. Patterning of the photoresist 70 is accomplished using standard techniques.

In accordance with the present invention, an energy of to the deep ion implant, as will be discussed further below, is adjusted in a prescribed manner to accomplish two things. First, the goal of the present method is to make Ldd regions in both the p-well 52 and n-well 54 regions using a single ldd ion implantation masking step. Secondly, an NMOS transistor will ultimately be formed in the p-well and a PMOS transistor will ultimately be formed in the n-well, wherein the p-well is characterized as having a desired highly doped deep doping profile.

Referring still to FIG. 2, with respect to the formation of the Ldd regions 72, 74, the Pldd implant 72 is characterized by an implant of a species which includes boron fluoride (BF$_2$), boron (B), or any molecule containing boron. Such a species constitutes a very small molecule. What that means is that at a given energy, there exists a fairly deep range to which the implant will go. In light of the PR pattern 70 above the n-well region 54, the range of implantation of the p-type ion is going to be controlled by the thickness of the PR pattern 70. The thickness of the PR pattern 70 is adjusted to a desired thickness during the formation thereof such that when the Pldd implant is performed, the desired Pldd regions 72 in the n-well 54 are formed. In other words, the Pldd regions 72 are the regions of the n-well in which the boron is to go. The depth of the Pldd implant in the n-well is on the order of 0.1 $\mu$m. The Pldd implant is thus conducted while the n-well region 54 is masked by the PR pattern 70. With respect to the p-well 52, the Pldd implant will go deep into the p-well. Since the substrate is p-type, more boron is added. It is also desirable to have a highly doped p+ region 76 below the transistor region of a yet to be formed NMOS device. Such a highly doped p+ region 76 below the transistor region of the NMOS device is desirable, for example, for latch-up purposes (i.e., prevention of device latch-up). The Pldd implant is thus a very conducive implant. The additional boron in the p-well 52 below the NMOS transistor region is advantageous for device performance and device properties. Note however, the boron implant must be far (i.e., deep) enough away from the channel region of a transistor such that the boron implant does not undesirably impact the threshold voltage (Vt) of the transistor.

With respect to the trench isolation or oxide 56, if boron does reside in the trench or oxide, it is not a problem. Depending on what the particular trench isolation step is, at worst case, there would always be a region below the trench isolation with the boron dopant in it.

As indicated herein above, in one embodiment, the photoresist 66, 68 used in the formation of the gate oxide 58, 62 and polysilicon gate electrode 60, 64 is left in place. The resist 66, 68 on top of the gate electrode regions 60, 64 also serves a slightly different purpose with respect to a channel region doping. Doping of the channel region is dependent in part upon a combination of factors, including ion implant energy level, polysilicon gate thickness, and the photoresist thickness above the polysilicon gate electrode. By modifying a thickness of the photoresist 66, 68, a desired doping configuration or profile can be made in which very little doping occurs in a respective channel region.

With respect to gate electrode doping 60, 64, a lightly doped drain (ldd) doping is much lower than a source/drain doping. However, depending upon a desired transistor circuit, there are different ways of making (i.e., providing a desired doping of) a gate electrode.

For example, the gate electrodes 60, 64 may include n+ doped gate electrodes for both n-channel and p-channel. Also, the gate electrode may include a p+ gate electrode for (PMOSFET) and an n+ gate electrode for the n-type MOSFET (NMOSFET). Essentially, doping of the gate electrode provides another degree of freedom in the fabrication of a MOS transistor device. As indicated above, doping of the gate electrode can be controlled by adjusting the thickness of the overlying photoresist pattern to provide a desired amount of doping during an ion implant, such as during the ldd implant.

As shown in FIG. 2, the n-well region 54 is masked off by a photoresist pattern 70. Resist 70 thickness H1 is on the order of 30,000 to 50,000 angstroms (Å), (10,000 Å=1 $\mu$m). Masking of the n-well region 54 facilitates a control of the formation of Pldd regions 72. The Pldd regions 72 are formed next to the edges of (i.e., adjacent to) a channel region underlying the polysilicon gate electrode 64 in the n-well region 54.

During the Pldd implant, Pldd regions 72 are formed in the n-well region 54. Simultaneously, with the formation of the Pldd regions 72, p-type dopants are also implanted in the p-well region 52 providing an additionally doped p-well as indicated by reference numeral 78. The additionally doped p-well advantageously impacts a performance of a transistor device yet to be formed in the p-well region 52. The p+ deep dopant is very beneficial for the yet to be formed NMOS transistor device, its properties, and its performance.

Figure 3:
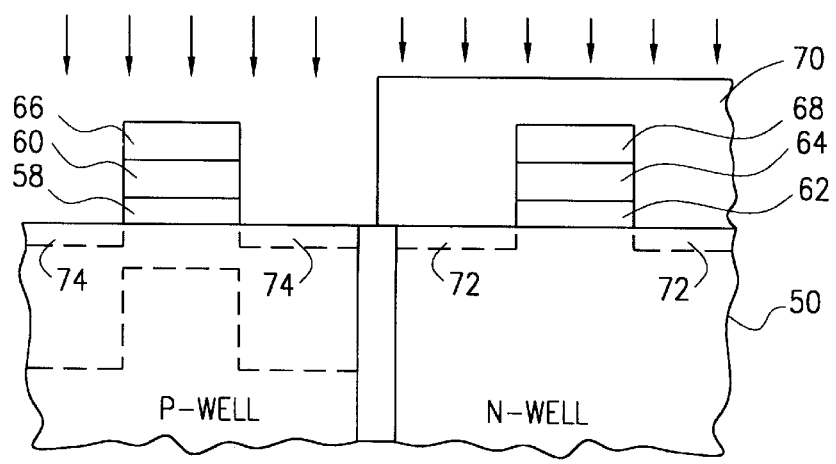
Figure 4:
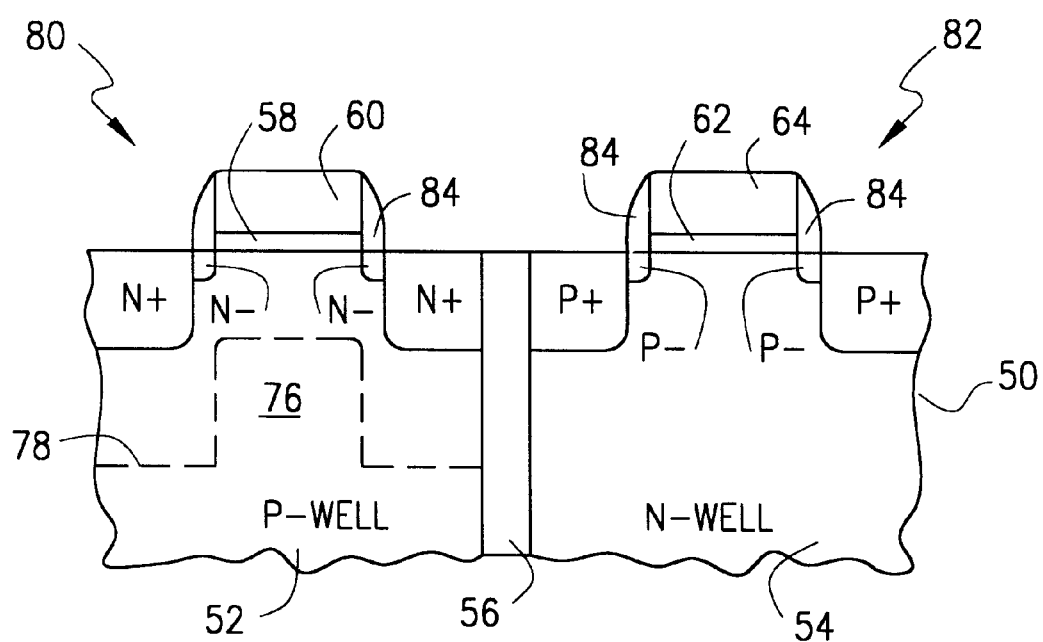
FIG. 4 illustrates an integrated circuit including transistor devices fabricated on a semiconductor substrate formed in accordance with the method of the present invention.

Turning now to FIG. 3, after the Pldd implant, a second lower energy Nldd implant is conducted. The Nldd implant is an n-type implant of species including arsenic (As), phosphorus (Phos), or combinations of As and Phos. The Nldd implant forms the NMOS ldd regions 74 in the p-well 52. The depth of the Nldd implant in the p-well is on the order of 0.1 $\mu$m. The Nldd implant does not enter the n-well 54 at all since the n-well 54 is blocked by the overlying photoresist pattern 70.

For the Nldd implant, the photoresist 66 on top of the polysilicon gate electrode 60 in the p-well region 52 plays a critical role. When doping with Phos, phosphorus is a very rapid diffuser relative to arsenic. In many processes, it is advantageous to prevent the phosphorous from entering the gate electrode region 60. The gate electrode region 60 can be doped at a later time, as desired, for example, to be a more heavily doped p-type region.

A key feature of the present invention is that both regions 72, 74 of ldd are advantageously formed with the use of only one ldd ion implantation masking layer. Reducing a number of masking steps in the manufacture of high performance integrated circuit devices advantageously reduces a cost of making the same. In addition, the resultant structure is of high integrity, having avoided multiple masking steps during the ldd region formation. Still further, a deep doping profile is also advantageously created during the formation of the Pldd regions. The deep doping profile provides a resultant device having a well-defined punch-thru region with a performance advantage.

An NMOS device is to be fabricated in the p-well since an n-channel will be created between a corresponding source and drain. The p-type substrate 50 remains under the n-well region 54, which is a function of how the present process was started off. That is, in this disclosure, a p-type substrate 50 with a p-epi layer was used for a starting substrate. The n-well 54 will have a typical depth of 1 to 2 $\mu$m, residing in the epi-layer. The p-well 52 will also reside within a depth of 1 to 2 $\mu$m, furthermore, possibly extending into the p+ substrate.

While the invention has been described as noted above, the order of the Pldd implant and the Nldd implant are interchangeable. The one ldd ion implantation masking step is used for providing a mask for use during both the Pldd and Nldd implant steps.

The implant energy for the Nldd is typically on the order of 10 to 50 KeV. The implant energy for the Pldd implant is typically on the order of 0.5 to 4 MeV (million electron volts, (0.5 MeV=500 KeV).

The Pldd implant does not adversely affect the Nldd implant with respect to the doping levels. The probability of the p-type dopant atoms hitting the n-type dopant atoms is pretty small, on the order of one in a million. Implanting with such a high energy for the Pldd implant, the p-type ions are implanted deep into the substrate in the p-well region 52. In the instance of the Nldd regions already being formed, the p-type ions also pass through the Nldd regions, wherein the Nldd regions are unaffected by the Pldd implant. Furthermore, with the high Pldd implant energy, an additional implant 78 is provided to the deeper regions of the p-well as discussed herein above. On the n-well side 54, Plld regions are created in the epi layer during the Pldd implant on opposite sides of the polysilicon gate electrode 64. The thickness of the PR masking layer 70 above the n-well 54 is appropriately selected (i.e., adjusted) such that a desired Pldd implant depth is obtained. The Pldd implant depth is a function of the masking PR thickness 70 and the implant energy level. Thus, the thickness of the PR mask 70 above the n-well 54 and the Pldd implant energy are adjusted to provide a desired Pldd implant depth.

Upon completion of the Pldd and Nldd implants, the substrate is annealed to activate the dopants in the respective regions. For example, any suitable RTA (rapid thermal anneal) known in the art may be used. Completion of a fabrication of NMOS 80 and PMOS 82 transistor devices using standard techniques can then be carried out (See FIG. 4). For example, sidewall spacers 84 are formed. The n-well region 54 is masked (not shown), followed by an N+ source/drain implant to the p-well 52 and anneal. The photoresist (not shown) for masking the n-well region 54 is then removed and then the p-well region 52 is masked (not shown). With the p-well region masked (not shown), a P+ source/drain implant into the n-well 54 is conducted followed by a suitable anneal.

Thus, there has been shown a method of forming both ldd implants in a CMOS device fabrication using a single masking step. No counter doping of the ldd regions is required, as in contrast with conventional techniques.

In a preferred embodiment, the Pldd implant is conducted before the Nldd implant. In addition, starting with a p-type substrate, the p-well is left exposed. The pldd implant thus goes deepest into the p-well region. Furthermore, if the p-type dopant of the Pldd implant does not make it deep into the substrate, then it would not adversely affect a device performance since the substrate started out as p-type.

While the resultant device 82 in the n-well looks similar to a typical transistor device, the device 80 fabricated in the p-well, however, is much different. The device 80 in the p-well is different in that it includes a higher doping profile (P+) characterized by a p+ dopant profile which tracks the corresponding gate electrode as illustrated by reference numeral 78 of FIG. 4. Assuming the thickness of the gate oxide, gate electrode, and the overlying photoresist has a combined thickness of H2 shown in FIG. 2, then the P+ dopant would be at an approximate depth of H1 in areas of the substrate in the p-well not covered by the gate electrode and at the depth of (H1–H2) in areas of the substrate covered by the gate electrode. The depth from the surface of the P+ region within the p-well is approximately on the order of the thickness H2, since ions will penetrate the photoresist more rapidly than the polysilicon or silicon. The resultant semiconductor structure includes different dopant regions having a contour similar to a surface contour of the substrate and gate electrode. Again, the p+ dopant essentially tracks the shape of the gate electrode. The photoresist above the gate electrode has a thickness much greater than the thickness of the gate electrode. For example, the photoresist 66 may include a thickness on the order of 10,000 Å, whereas the gate electrode 60 may include a thickness on the order of 2,000–3,000 Å.

Further, in accordance with the present invention, a punch-thru doping region may also be formed. The height of the photoresist can be adjusted or tailored as necessary to provide a desired channel region. As noted above, the p-type dopant profile follows the shape of the gate electrode. The implant energy, in combination with the thickness of the photoresist, gate electrode and gate oxide, can be adjusted (i.e., selected) for also providing a desired punch-thru region. A punch-thru region ensures a desired channel formation (i.e., channel thickness).

The present invention thus provides a more highly doped p+ region within a p-well (i.e., the p+ profile) which tracks a shape of an overlying gate electrode. Furthermore, the present invention provides for the formation of ldd regions in both the n-well and p-well using a single masking step. Still further, a resultant semiconductor device structure including NMOS and PMOS transistors is provided having been fabricated using the method of the present invention.

While the invention has been described having the n-well masked, the p-well could alternatively be masked leaving the n-well exposed. Recall that the phosphorus to boron ratio is on the order of three to one. It will require more energy to implant the phosphorus deep into the substrate, however, as devices are scaled, this can also be done. The present invention is intended to cover this latter alternative also. In other words, the single masking step can be done with respect to covering the p-well, with appropriate modifications in line with the method according to the present invention as disclosed.

For a better understanding the characteristics of the deep doping profile according to the present invention, a brief description of punch-thru shall now be presented with respect to an n-channel MOSFET. A positive voltage applied to the gate electrode inverts the channel of the nMOSFET and a flow of electrons occurs from the source to the drain. There is some probability of current leaking underneath the bottom of the channel. By putting a punch-thru implant (or region) in the device below the channel region, any undesirable current leakage is prevented. The punch-thru implant provides an extra protection such that the electron flow will always be defined along the surface of the transistor which contributes to the maximum switching properties of the transistor device. The punch-thru region is thus a region more highly doped than the Vt implant region, having a dopant concentration determined in part upon the p-well deep implant. The punch-thru region prevents formation of the n-channel into the area of the punch-thru region when a positive voltage is applied to the gate electrode.

In the instance of providing a Vt implant, the Vt implant is a very shallow implant, i.e., next to the surface of the substrate corresponding to the gate oxide/silicon interface. The Vt implant is responsible for a desired conduction of the channel. That is, the purpose of the Vt implant is to affect the voltage (gate voltage) at which the channel is formed in the transistor region. When applying a positive voltage to the gate electrode, the dopant in the channel determines what the threshold voltage will be of the device. The Vt implant thus establishes/alters the threshold voltage of the device. Vt is controlled by doping of the channel of the device to have a certain desired dopant concentration.

In accordance with the present invention, a semiconductor substrate 50 having desired Pldd 72 and Nldd 74 regions of respective n-well 54 and p-well 52 regions are formed by the method as discussed herein above. In addition, the present invention includes an integrated circuit having transistor devices 82, 80 fabricated on the semiconductor substrate 50 having desired Pldd 72 and Nldd 74 regions of respective n-well 54 and p-well 52 regions, further having a desired p-well NMOS transistor deep doping profile as illustrated by reference numeral 78 of FIG. 4.

Thus, in accordance with the present invention, a new method has been disclosed which utilizes a single masking step in the ion implantation formation of Pldd and Nldd regions of a semiconductor substrate.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A semiconductor substrate having lightly doped drain regions formed by a method comprising the steps of:

providing a semiconductor substrate having a p-well region and an n-well region;

forming a patterned gate oxide and gate electrode on each of the p-well region and the n-well region;

masking one of either the p-well region or the n-well region with a patterned photoresist having a prescribed thickness, leaving a non-masked region exposed;

implanting ions to form desired p-type lightly doped drain (Pldd) regions in the n-well region, including Pldd regions adjacent to edges of the gate electrode in the n-well region such that said implantation in the n-well is on the order of 0.1 $\mu$m or less; and implanting ions to form desired n-type lightly doped drain (Nldd) regions in the p-well region, including Nldd regions adjacent to edges of the gate electrode in the p-well region, the Pldd and Nldd regions thus being formed with the use of only a single ion implantation masking step.

2. The semiconductor substrate having lightly doped drain regions of claim 1, wherein
said ion implantation masking step includes masking the n-well region and leaving the p-well region exposed,
said step of implanting ions to form desired Pldd regions in the n-well region includes implanting species of ions selected from the group consisting of arsenic (As), phosphorus (Phos), and combinations of As and Phos, and
said step of implanting ions to form desired Nldd regions in the p-well region includes implanting species of ions selected from the group consisting of boron fluoride ($BF_2$), boron (B), and any molecule containing boron, and
said step of providing the semiconductor substrate further includes providing an isolation region in between the p-well region and the n-well region.

3. The semiconductor substrate having lightly doped drain regions of claim 1, wherein
said step of forming the patterned gate oxide and gate electrode on each of the p-well region and the n-well region includes leaving a photoresist pattern in place above respective gate electrodes, the photoresist pattern having been used in the formation of the respective patterned gate oxide and gate electrode on each of the p-well region and the n-well region, and
the photoresist pattern and the respective patterned gate oxide and gate electrode on the p-well region together include a prescribed total thickness for obtaining a desired deep doping p+ profile in the p-well during said Pldd ion implanting step, the deep doping p+ profile having a shape which substantially tracks a shape of a respective overlaying gate oxide and gate electrode.

4. An integrated circuit having transistor devices fabricated on a semiconductor substrate having lightly doped drain regions, the semiconductor substrate formed by a method comprising the steps of:
providing a semiconductor substrate having a p-well region and an n-well region;
forming a patterned gate oxide and gate electrode on each of the p-well region and the n-well region;
masking one of either the p-well region or the n-well region with a patterned photoresist having a prescribed thickness, leaving a non-masked region exposed;
implanting ions to form desired n-type lightly doped drain (Nldd) regions in the p-well region, including Nldd regions adjacent to edges of the gate electrode in the p-well region, the Pldd and Nldd regions thus being formed with the use of only a single ion implantation masking step.

5. The integrated circuit of claim 4, further comprising:
an NMOS transistor device formed in the p-well region and a PMOS transistor device formed in the p-well region and a PMOS transistor device formed in the n-well region, wherein the NMOS transistor is characterized by a deep doping p+ profile in the p-well which substantially tracks a shape of a respective overlying gate oxide and gate electrode.

6. The integrated circuit of claim 4, wherein
said ion implantation masking step includes masking the n-well region and leaving the p-well region exposed,
said step of implanting ions to form desired Pldd regions in the n-well region includes implanting species of ions selected from the group consisting of arsenic (As), phosphorus (Phos), and combinations of As and Phos, and
said step of implanting ions to form desired Nldd regions in the p-well region includes implanting species of ions selected from the group consisting of boron fluoride ($BF_2$), boron (B), and any molecule containing boron, and
said step of providing the semiconductor substrate further includes providing an isolation region in between the p-well region and the n-well region.

7. The integrated circuit of claim 4, wherein
said step of forming the patterned gate oxide and gate electrode on each of the p-well region and the n-well region includes leaving a photoresist pattern in place above respective gate electrodes, the photoresist pattern having been used in the formation of the respective patterned gate oxide and gate electrode on each of the p-well region and the n-well region, and
the photoresist pattern and the respective patterned gate oxide and gate electrode on the p-well region together include a prescribed total thickness for obtaining a desired deep doping p+ profile in the p-well during said Pldd ion implanting step, the deep doping p+ profile having a shape which substantially tracks a shape of a respective overlying gate oxide and gate electrode.

* * * * *

UNITED STATES PATENT AND TRADEMARK OFFICE
CERTIFICATE OF CORRECTION

PATENT NO. : 6,043,533  
DATED : March 28, 2000  
INVENTOR(S) : Gardner et al.

Page 1 of 1

It is certified that error appears in the above-identified patent and that said Letters Patent is hereby corrected as shown below:

Column 1,
Line 18, Replace "insulated-gate to (IG)" With -- insulated gate (IG) --

Column 2,
Line 58, Replace "thickness, to leaving" With -- thickness, leaving --

Column 4,
Line 5, Replace "Referring flow to FIG. 2" With -- Referring now to FIG. 2" --
Line 14, Replace "energy of to the deep" With -- energy of the deep --

Column 9,
Line 34, Replace "respective overlaying" With -- respective overlying --
Line 47, Insert -- implanting ions to form desired p-type lightly doped drain (Pldd) regions in the n-well region, including Pldd regions adjacent to edges of the gate electrode in the n-well region; and --

Column 10,
Lines 7-8, Delete "p-well region and a PMOS transistor device formed in the"

Signed and Sealed this

Thirteenth Day of November, 2001

Attest:

NICHOLAS P. GODICI  
Attesting Officer  
Acting Director of the United States Patent and Trademark Office